(12) United States Patent
Park et al.

(10) Patent No.: US 8,447,247 B2
(45) Date of Patent: May 21, 2013

(54) APPARATUS AND METHOD FOR COMPENSATING TX GAIN IN WIRELESS COMMUNICATION SYSTEM

(75) Inventors: Hung-Su Park, Suwon-si (KR); Dong-Kyoon Cho, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 4 days.

(21) Appl. No.: 13/305,248

(22) Filed: Nov. 28, 2011

(65) Prior Publication Data

US 2012/0135697 A1    May 31, 2012

(30) Foreign Application Priority Data

Nov. 26, 2010  (KR) .......................... 10-2010-0118499

(51) Int. Cl.
*H04B 1/04* (2006.01)
*H01Q 11/12* (2006.01)

(52) U.S. Cl.
USPC ..................................... 455/114.2; 455/127.2

(58) Field of Classification Search ............... 455/114.2, 455/114.3, 126, 127.2
See application file for complete search history.

(56) References Cited

U.S. PATENT DOCUMENTS

2009/0072900 A1 * 3/2009 Park et al. ...................... 330/149
2011/0025414 A1 * 2/2011 Wolf et al. ..................... 330/149

* cited by examiner

*Primary Examiner* — Nguyen Vo
(74) *Attorney, Agent, or Firm* — The Farrell Law Firm P.C.

(57) ABSTRACT

An apparatus and a method for compensating for a Transmission (Tx) gain in a transmitter of a wireless communication system are provided. The apparatus includes a Tx Automatic Gain Control (AGC) for generating at least an adjustment value for controlling a Tx gain; a Tx Power Adjust (TPA) controller for generating a compensation value for compensating for Nonlinear Compensate Table (NCT) control information using frequency and temperature changes according to operations of the transmitter and the adjustment value provided from the Tx AGC; and an NCT controller for generating the NCT control information using the adjustment value provided from the Tx AGC, and compensating for the NCT control information with the compensation value output from the TPA controller.

14 Claims, 5 Drawing Sheets

APPARATUS AND METHOD FOR COMPENSATING TX GAIN IN WIRELESS COMMUNICATION SYSTEM

PRIORITY

The present application claims priority under 35 U.S.C. §119(a) to a Korean patent application filed in the Korean Intellectual Property Office on Nov. 26, 2010, and assigned Serial No. 10-2010-0118499, the entire content of which is incorporated herein by reference.

BACKGROUND OF THE INVENTION

1. Field of the Invention

The present invention relates generally to an apparatus and a method for compensating for a Transmission (Tx) gain in a wireless communication system, and more particularly, to an apparatus and a method for compensating for a Tx gain according to frequency and temperature changes in a transmitter of a wireless communication system.

2. Description of the Related Art

A Power Amplifier (PA) used in a transmitter of a wireless communication system may be controlled at various levels. For example, a three-level scheme may include high-level, mid-level, and low-level.

A gain of the PA varies according to a mode transition. Accordingly, a Tx Automatic Gain Control (AGC) adjusts the Tx gain using a Nonlinear Compensate Table (NCT) not to change a final Tx power of the PA.

Characteristics of the corresponding PA vary according to the temperature and the frequency. Hence, the transmitter according to the related art is required to update the NCT base on the changes of the temperature and the frequency. For example, the NCT has characteristics based on the temperature and frequency changes as shown in FIGS. 1A and 1B.

FIGS. 1A and 1B are graphs of the NCT characteristics according to the temperature and frequency change in the related art.

FIG. 1A depicts the NCT characteristics based on the frequency change, and FIG. 1B depicts the NCT characteristics based on the temperature change.

FIG. 1A depicts the NCT characteristics based on the frequency change using a Universal Mobile Telephony System (UMTS) Terrestrial Radio Access (UTRA) Absolute Radio Frequency Channel Number (UARFCN) sample of Table 1, among 277 channels in total, based on the band 1.

TABLE 1

| F0 | F1 | F2 | F3 | F4 |
|---|---|---|---|---|
| 9612 | 9675 | 9750 | 9825 | 9888 |

As shown in Table 1, the PA cannot precisely control the power in the mid level 100 and the high level 110 according to the frequency change even by regulating the Tx gain using the NCT. Here, the 'F' indicates frequency.

FIG. 1B depicts the NCT characteristics at five temperatures of Table 2.

TABLE 2

| T0 | T1 | T2 | T3 | T4 |
|---|---|---|---|---|
| −20° C. | 0° C. | 20° C. | 40° C. | 60° C. |

As shown in Table 2, the PA cannot precisely control the power in the mid level 120 and the high level 130 according to the temperature change even by regulating the Tx gain using the NCT. Here, the 'T' indicates temperature.

In this respect, systems according to the related art are unable to adjust the Tx gain according to the temperature and frequency change such that the final Tx power in the PA does not vary.

SUMMARY OF THE INVENTION

The present invention is designed to address at least the above-mentioned problems and/or disadvantages and to provide at least the advantages described below. Accordingly, an aspect of the present invention is to provide an apparatus and a method for adjusting a Tx gain according to temperature and frequency changes in a transmitter of a wireless communication system.

Another aspect of the present invention is to provide an apparatus and a method for adjusting a Tx gain by considering frequency and temperature changes and a mode of a power amplifier in a transmitter of a wireless communication system.

Yet another aspect of the present invention is to provide an apparatus and a method for compensating for NCT control information according to frequency and temperature changes in a transmitter of a wireless communication system.

According to one aspect of the present invention, an apparatus for compensating for a Tx gain in a transmitter of a wireless communication system is provided. The apparatus includes a Tx Automatic Gain Control (AGC) for generating at least one adjustment value for controlling a Tx gain; a Tx Power Adjust (TPA) controller for generating a compensation value for compensating for Nonlinear Compensate Table (NCT) control information using frequency and temperature change according to operations of the transmitter and the at least one adjustment value provided from the Tx AGC; and an NCT controller for generating the NCT control information using the at least one adjustment value provided from the Tx AGC, and compensating for the NCT control information with the compensation value output from the TPA controller.

According to another aspect of the present invention, a method for compensating for a Tx gain in a transmitter of a wireless communication system is provided. The method includes checking frequency and temperature change occurring during operation of the transmitter, and checking an operation mode of a power amplifier; checking at least one variable for compensating for Nonlinear Compensate Table (NCT) control information in consideration of the frequency and temperature change in the transmitter operation and the operation mode of the power amplifier; generating a compensation value for compensating for the NCT control information using the at least one variable; and compensating for the NCT control information with the compensation value.

BRIEF DESCRIPTION OF THE DRAWINGS

The above and other aspects, features, and advantages of certain embodiments of the present invention will be more apparent from the following description taken in conjunction with the accompanying drawings, in which.

DETAILED DESCRIPTION OF EMBODIMENTS OF THE PRESENT INVENTION

Figure 1A:
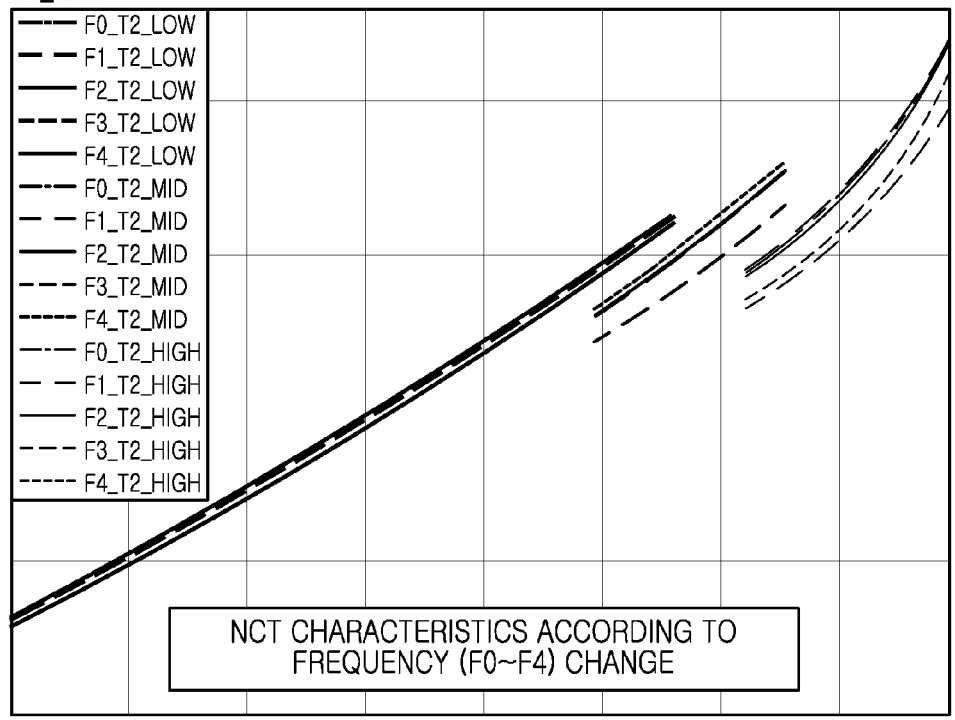
FIGS. 1A and 1B are graphs illustrating NCT characteristics according to temperature and frequency changes in the related art.
Figure 1B:
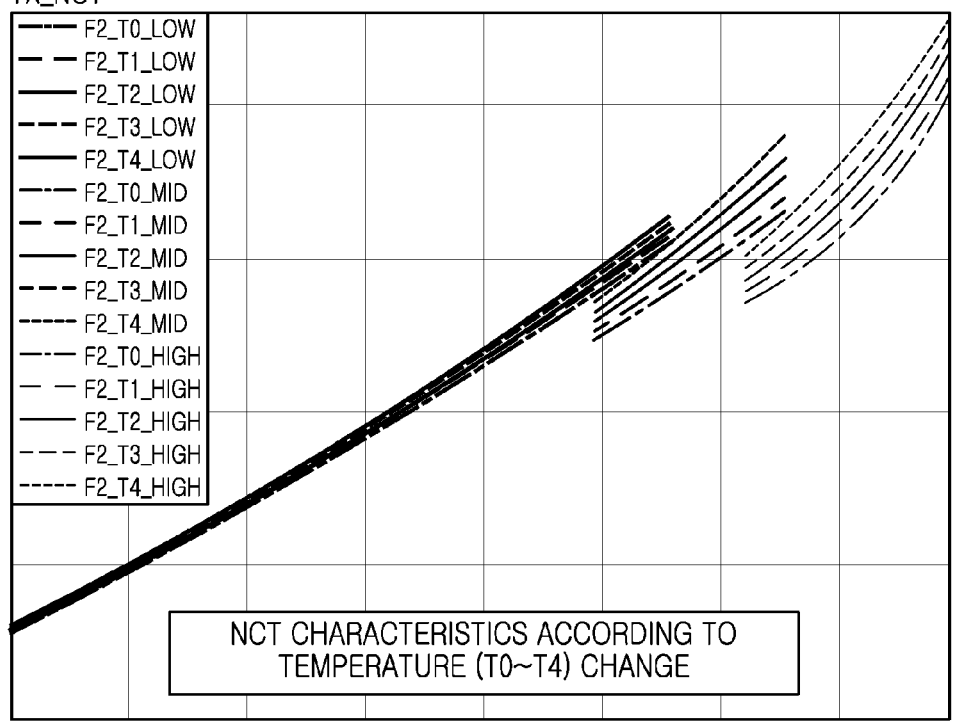

The following description with reference to the accompanying drawings is provided to assist in a comprehensive understanding of embodiments of the invention as defined by the claims and their equivalents. This description includes various specific details to assist in that understanding that are merely provided as examples. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness. Throughout the drawings, like reference numerals may be understood to refer to like parts, components and structures.

The terms and words used in the following description and claims are not limited to the bibliographical meanings, but are merely used by the inventor to enable a clear and consistent understanding of the invention.

Herein, the singular forms "a," "an," and "the" may include plural referents, unless the context clearly dictates otherwise. Thus, for example, reference to "a component surface" includes reference to one or more of such surfaces.

Herein, the term "substantially" indicates that the recited characteristic, parameter, or value need not be achieved exactly, but that deviations or changes, including for example, tolerances, measurement error, measurement accuracy limitations and other factors known to those of skill in the art, may occur in amounts that do not preclude the effect the characteristic was intended to provide.

Embodiments of the present invention may provide a technique for compensating for a Tx gain according to frequency and temperature change in a transmitter of a wireless communication system.

Figure 2:
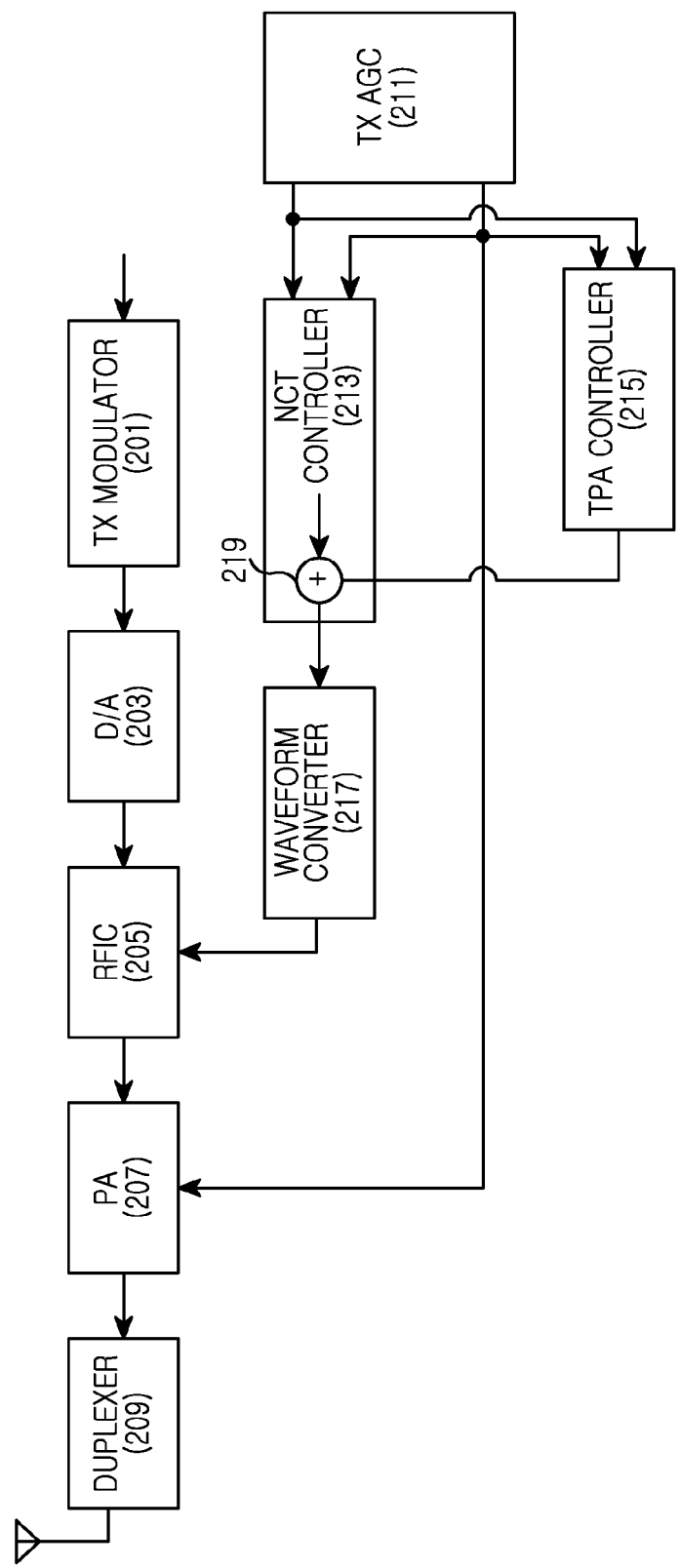
FIG. 2 is a block diagram illustrating a transmitter according to an embodiment of the present invention.

FIG. 2 is a block diagram illustrating a transmitter according to an embodiment of the present invention.

Referring to FIG. 2, the transmitter includes a Tx modulator 201, a Digital/Analog Converter (D/A) 203, a Radio Frequency Integrated Circuit (RFIC) 205, a Power Amplifier (PA) 207, a duplexer 209, a Tx Automatic Gain Control (AGC) 211, a Nonlinear Compensate Table (NCT) controller 213, a Tx Power Adjust (TPA) controller 215, and a waveform converter 217.

The Tx modulator 201 generates and encodes a signal to be transmitted from the transmitter.

The D/C 203 converts a digital signal output from the Tx modulator 201 to an analog signal.

The RFIC 205 converts the signal output from the D/A 203 to an RF signal according to Serial Peripheral Interface (SPI) or Pulse Width Modulation (PWM) waveform information provided from the waveform converter 217.

The PA 207 amplifies the power of the RF signal output from the RFIC 205, and the amplified RF signal is transmitted via the duplexer 209 and an antenna under control of the Tx AGC 211.

The Tx AGC 211 generates an adjustment value for the Tx gain. For example, the Tx AGC 211 generates mode control information PA_MODE for controlling a mode of the PA 207, and Tx power information Tx_POW for controlling the Tx power.

Figure 3:
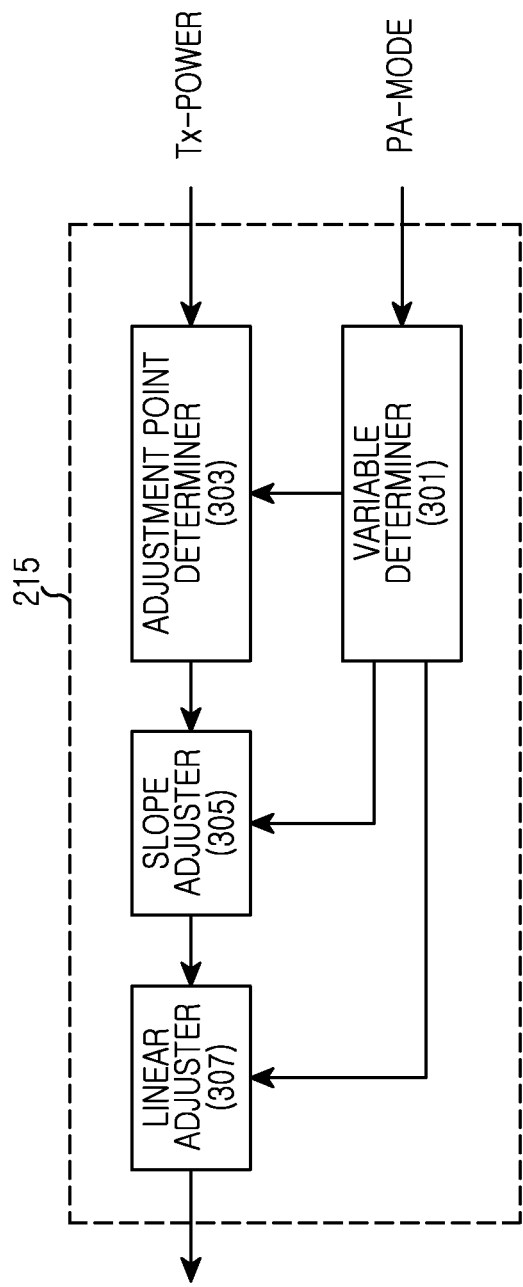
FIG. 3 is a detailed block diagram illustrating a TPA controller according to an embodiment of the present invention.

The TPA controller 215 generates a compensation value for compensating for NCT control information of the NCT controller 213 using the mode control information and the Tx power information provided from the Tx AGC 211. More specifically, the TPA controller 215 generates the compensation value for compensating for the NCT control information according to frequency and temperature change such that the final Tx power in the PA 207 is constant regardless of the frequency and temperature change. For example, the TPA controller 215 stores adjustment point variable values, slope adjustment variable values, and linear adjustment variable values based on the frequency and temperature change. The TPA controller 215 selects the adjustment point variable, the slope adjustment variable, and the linear adjustment variable according to the frequency and the temperature of the transmitter and the mode control information. Next, the TPA controller 215 generates the compensation value for compensating for the NCT control information by converting the Tx power information using the variables as shown in FIG. 3.

The NCT controller 213 generates the NCT control information using the mode control information and the Tx power information provided from the Tx AGC 211 to compensate for nonlinearity of the Tx path. In so doing, the NCT controller 213 generates the NCT control information by considering the gain of the RFIC 205.

After the NCT control information is generated, the NCT controller 213 compensates for the NCT control information by combining the NCT control information and the compensation value output from the TPA controller 215 using an adder 219. For example, the NCT controller 213 may compensate for the NCT control information by adding the compensation value output from the TPA controller 215 to a high-resolution part of the NCT control information. In performing this compensation, the NCT controller 213 may include an NCT control information generator (not shown) for generating the NCT control information, and the adder 219.

The waveform converter 217 converts the compensated NCT control information output from the NCT controller 213 into the SPI waveform or the PWM waveform according to the interface of the RFIC 205, and sends it to the RFIC 205.

FIG. 3 is a detailed block diagram illustrating a TPA controller according to an embodiment of the present invention.

As shown in FIG. 3, the TPA controller 215 includes a variable determiner 301, an adjustment point determiner 303, a slope adjuster 305, and a linear adjuster 307.

The variable determiner 301 determines the adjustment point variable, the slope adjustment variable, and the linear adjustment variable according to the temperature and the frequency of the transmitter and the mode control information. For example, the variable determiner 301 stores a table including the adjustment point variable values, the slope adjustment variable values, and the linear adjustment variable values based on the frequency and temperature change. In the table, the variable determiner 301 selects the adjustment point variable, the slope adjustment variable, and the linear adjustment variable according to the frequency and the temperature of the transmitter and the mode control information. Herein, the table includes variables determined by measuring the Tx gain characteristics according to the frequency and temperature changes when the transmitter is initially manufactured.

Figure 4:
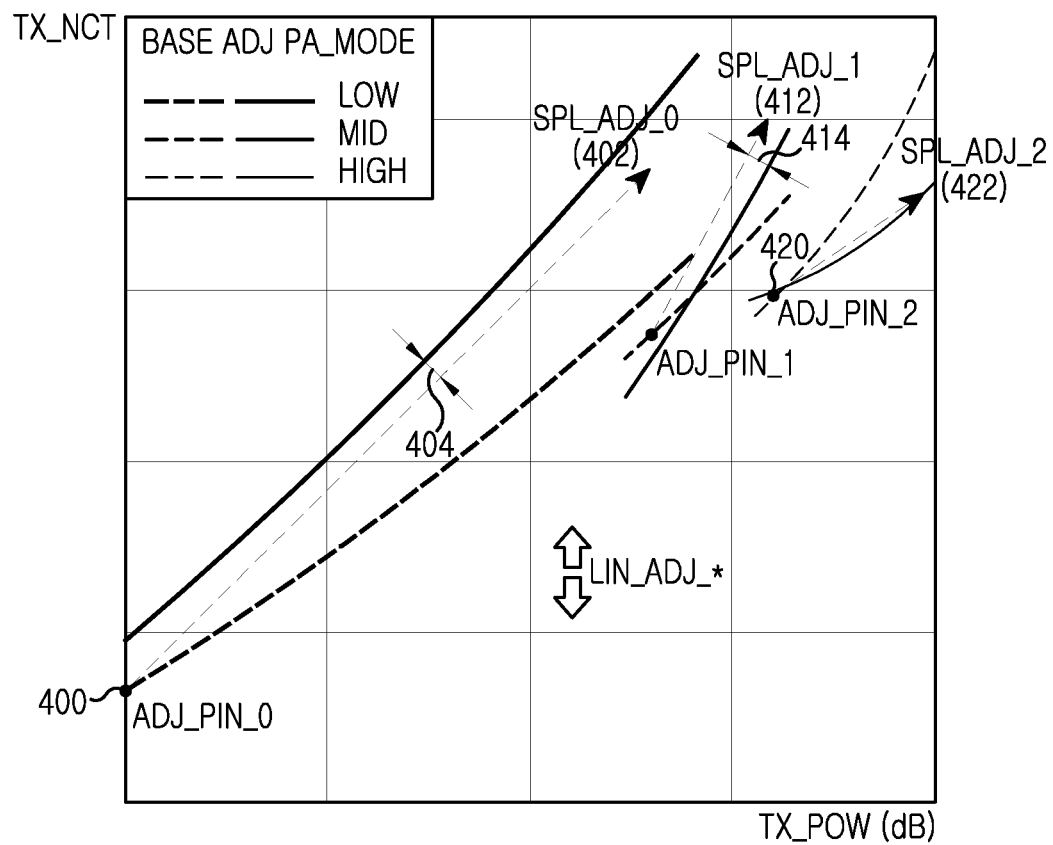
FIG. 4 is a graph of phase and offset compensation illustrating the Tx power according to an embodiment of the present invention.

The adjustment point determiner 303 determines the adjustment point for compensating for the Tx power information in consideration of the adjustment point variable output from the variable determiner 301. For example, in a system with three levels (i.e., a low level, a mid level, and a high level), when the mode of the PA 207 is set to the low level, the adjustment point determiner 303 determines a first adjustment point 400 of FIG. 4 as the adjustment point for compensating for the Tx power information. When the mode of the PA 207 is set to the mid level, the adjustment point determiner 303 determines a second adjustment point 410 of FIG. 4 as the adjustment point for compensating for the Tx power information. When the mode of the PA 207 is set to the high level, the adjustment point determiner 303 determines a third adjustment point 420 of FIG. 4 as the adjustment point for compensating for the Tx power information.

The slope adjuster 305 compensates for the slope of the Tx power information according to the slope adjustment variable output from the variable determiner 301 based on the adjustment point determined by the adjustment point determiner 303. For example, when the mode of the PA 207 is set to the low level, the slope adjuster 305 compensates for the slope value of the Tx power information with the slope adjustment variable 402 based on the first adjustment point 400 of FIG. 4. When the mode of the PA 207 is set to the mid level, the slope adjuster 305 compensates for the slope value of the Tx power information with the slope adjustment variable 412 based on the second adjustment point 410 of FIG. 4. When the mode of the PA 207 is set to the high level, the slope adjuster 305 compensates for the slope value of the Tx power information with the slope adjustment variable 422 based on the third adjustment point 420 of FIG. 4. In so doing, the slope adjuster 305 may divide the slope by a slope compensation variable in accordance with the slope of the compensated Tx power information. Here, the slope compensation variable may be set as '128'.

The linear adjuster 307 compensates for the Tx power information with the slope adjusted by the slope adjuster 305, according to the linear adjustment variable output from the variable determiner 301. For example, when the mode of the PA 207 is set to the low level, the linear adjuster 307 compensates for the Tx power information the compensated slope according to the linear adjustment variable output from the variable determiner 301 in step 404. When the mode of the PA 207 is set to the mid level, the linear adjuster 307 compensates for the Tx power information with the compensated slope according to the linear adjustment variable output from the variable determiner 301 in step 414. When the mode of the PA 207 is set to the high level, the linear adjuster 307 compensates for the Tx power information of the compensated slope according to the linear adjustment variable output from the variable determiner 301.

Figure 5:
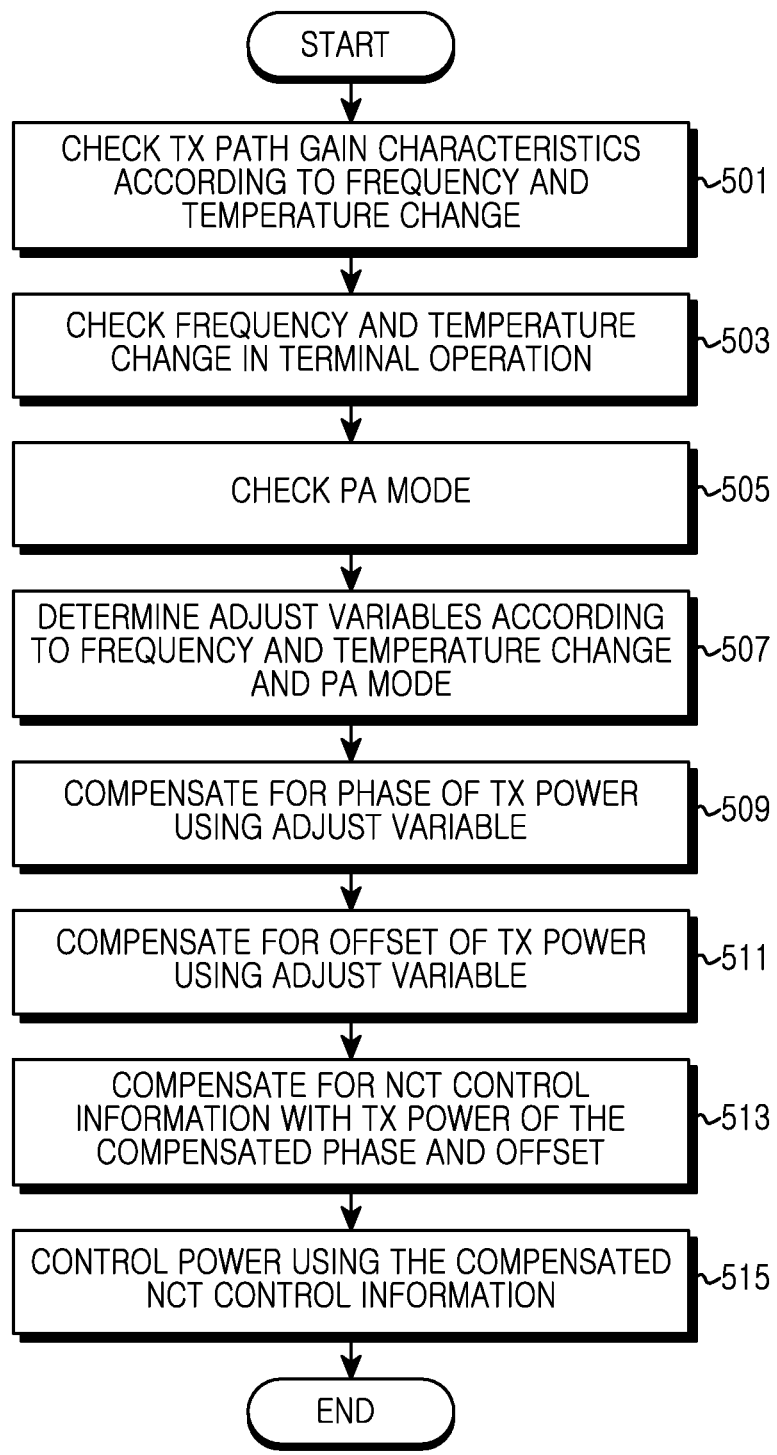
FIG. 5 is a flowchart illustrating a method for controlling the Tx gain according to the frequency and temperature changes according to an embodiment of the present invention.

FIG. 5 is a flowchart illustrating a method for controlling the Tx gain according to the frequency and temperature changes according to an embodiment of the present invention.

Referring to FIG. 5, the transmitter checks the Tx gain characteristics according to frequency and temperature changes in step 501. For example, the transmitter checks the table including the adjustment point variable, the slope adjustment variable, and the linear adjustment variable based on the frequency and temperature change stored to the variable determiner 301 of FIG. 3. The table may include the variables determined by measuring the Tx gain characteristics according to frequency and temperature change when the transmitter is initially manufactured.

In step 503, the transmitter checks the frequency and temperature changes according to the terminal operation. For example, when the transmitter is initially operated, the transmitter checks the frequency and the temperature required at the initial operation. Alternatively, the transmitter may check the frequency and temperature change by examining the current frequency and temperature in the operation.

In step 505, the transmitter checks the mode of the PA. For example, the transmitter confirms the mode control information generated by the Tx AGC 211.

In step 507, the transmitter selects the adjustment point variable, the slope adjustment variable, and the linear adjustment variable according to the frequency and temperature change of the transmitter and the mode control information.

In step 509, the transmitter compensates for the phase of the Tx power information using the adjustment point variable and the slope adjustment variable. For example, when the mode of the PA 207 is set to the low level in FIG. 4, the adjustment point determiner 303 and the slope adjuster 305 of the transmitter compensate for the slope value of the Tx power information based on the first adjustment point 400. In so doing, the slope adjuster 305 may divide the slope by a slope compensation variable in accordance with the slope of the compensated Tx power information. Herein, the Tx power information is generated by the Tx AGC 211.

In step 511, the transmitter compensates for the Tx power information of the compensated phase using the linear adjustment variable. For example, when the mode of the PA 207 is set to the low level in FIG. 4, the linear adjuster 305 of the transmitter compensates for the Tx power information of the compensated slope according to the linear adjustment variable in step 404.

In step 513, the transmitter compensates for the NCT control information using the Tx power information of the compensated phase and offset. For example, to compensate for the nonlinearity of the Tx path, the NCT controller 213 of the transmitter generates the NCT control information using the mode control information and the Tx power information provided from the Tx AGC 211. Next, the NCT controller 213 compensates for the NCT control information by combining the NCT control information and the Tx power information of the compensated phase and offset using the adder 219.

In step 515, the transmitter controls the power using the compensated NCT control information, and the process subsequently ends.

According to the above-described embodiments of the present invention, a transmitter may compensate for the NCT control information based on the frequency and temperature change by selecting the adjustment variables based on the frequency and the temperature. When confirming at least one of the frequency and temperature change and the PA mode change, the transmitter can compensate for the NCT control information by selecting new adjustment variables.

As set forth above, the transmitter of the wireless communication system compensates for the NCT control information according to the frequency and temperature change and the PA mode. Therefore, power control efficiency of the transmitter can be enhanced by compensating for variation between components of the RFIC and the PA and variation in the manufacture of the transmitter.

While the invention has been shown and described with reference to certain embodiments thereof, it will be understood by those skilled in the art that various changes in form and details may be made therein without departing from the spirit and scope of the invention as defined by the appended claims and their equivalents.

What is claimed is:

1. An apparatus for compensating for a Transmission (Tx) gain in a transmitter of a wireless communication system, comprising:

a Tx Automatic Gain Control (AGC) for generating an adjustment value for controlling a Tx gain;

a Tx Power Adjust (TPA) controller for generating a compensation value for compensating for Nonlinear Compensate Table (NCT) control information using frequency and temperature changes according to operations of the transmitter and the adjustment value provided from the Tx AGC; and an NCT controller for generating the NCT control information using the adjustment value provided from the Tx AGC, and compensating for the NCT control information with the compensation value output from the TPA controller.

2. The apparatus of claim 1, wherein the Tx AGC generates Tx power information for controlling a Tx power, and mode control information of a power amplifier.

3. The apparatus of claim 2, wherein the TPA controller comprises:
a variable determiner for determining an adjustment point variable, a slope adjustment variable, and a linear adjustment variable according to the frequency and temperature changes in the transmitter operation and the mode control information of the power amplifier provided from the Tx AGC;
an adjustment point determiner for determining an adjustment point for compensating for the Tx power information provided from the Tx AGC by considering the adjustment point variable output from the variable determiner;
a slope adjuster for compensating for a slope of the Tx power information with the slope adjustment variable output from the variable determiner according to the adjustment point determined by the adjustment point determiner; and
a linear adjuster for generating the compensation value for compensating for the NCT control information by compensating for an offset of the Tx power information of the compensated slope according to the linear adjustment variable output from the variable determiner.

4. The apparatus of claim 3, wherein the variable determiner stores adjustment point variables, slope adjustment variables, and linear adjustment variables determined according to Tx gain characteristics according to frequency and temperature changes when the transmitter is initially manufactured, and
the variable determiner selects an adjustment point variable, a slope adjustment variable, and a linear adjustment variable among the stored adjustment point variables, slope adjustment variables, and linear adjustment variables, according to the frequency and temperature changes in the transmitter operation and the mode control information of the power amplifier provided from the Tx AGC.

5. The apparatus of claim 3, wherein the slope adjuster compensates for the slope of the Tx power information with the slope adjustment variable provided from the variable determiner according to the adjustment point determined by the adjustment point determiner, and divides the slope by a slope compensation variable in accordance with the slope of the compensated Tx power information.

6. The apparatus of claim 1, wherein the NCT controller comprises:
an NCT control information generator for generating the NCT control information using the adjustment value provided from the Tx AGC; and
an adder for combining the compensation value output from the TPA controller and the NCT control information.

7. The apparatus of claim 1, further comprising:
a waveform converter for converting the compensated NCT control information into a Serial Peripheral Interface (SPI) waveform or a Pulse Width Modulation (PWM) waveform according to an interface of a Radio Frequency Integrated Circuit (RFIC).

8. A method for compensating for a Transmission (Tx) gain in a transmitter of a wireless communication system, comprising:
checking frequency and temperature changes occurring during operation of the transmitter, and checking an operation mode of a power amplifier;
checking a variable for compensating for Nonlinear Compensate Table (NCT) control information in consideration of the frequency and temperature change in the transmitter operation and the operation mode of the power amplifier;
generating a compensation value for compensating for the NCT control information using the variable; and
compensating for the NCT control information with the compensation value.

9. The method of claim 8, wherein the variable comprises at least one of an adjustment point variable, a slope adjustment variable, and a linear adjustment variable.

10. The method of claim 9, wherein generating the compensation value comprises:
determining an adjustment point for compensating for Tx power information of the transmitter by considering the adjustment point variable;
compensating for a slope of the Tx power information with the slope adjustment variable according to the adjustment point; and
generating the compensation value for compensating for the NCT control information by compensating for an offset of the Tx power information of the compensated slope according to the linear adjustment variable.

11. The method of claim 10, wherein compensating the slope comprises:
compensating for the slope of the Tx power information with the slope adjustment variable according to the adjustment point; and
dividing the slope by a slope compensation variable in accordance with the slope of the compensated Tx power information.

12. The method of claim 8, wherein checking the variable comprises:
selecting an adjustment point variable, a slope adjustment variable, and a linear adjustment variable among adjustment point variables, slope adjustment variables, and linear adjustment variables determined by measuring Tx gain characteristic according to frequency and temperature changes when the transmitter is initially manufactured, according to the frequency and temperature changes in the transmitter operation and mode control information of the power amplifier provided from a Tx Automatic Gain Control (AGC).

13. The method of claim 12, wherein the NCT control information is generated using at least one of operation mode information of the power amplifier and the Tx power information generated by the Tx AGC.

14. The method of claim 8, further comprising:
converting the compensated NCT control information into a Serial Peripheral Interface (SPI) waveform or a Pulse Width Modulation (PWM) waveform according to an interface of a Radio Frequency Integrated Circuit (RFIC).

* * * * *